United States Patent
Kwon et al.

(10) Patent No.: US 11,515,161 B2
(45) Date of Patent: Nov. 29, 2022

(54) LOW DEFECT NUCLEAR TRANSMUTATION DOPING IN NITRIDE-BASED SEMICONDUCTOR MATERIALS

(71) Applicant: The Curators of the University of Missouri, Columbia, MO (US)

(72) Inventors: Jae Wan Kwon, Columbia, MO (US); John Gahl, Columbia, MO (US); John Brockman, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 280 days.

(21) Appl. No.: 16/852,186

(22) Filed: Apr. 17, 2020

(65) Prior Publication Data

US 2020/0365406 A1 Nov. 19, 2020

Related U.S. Application Data

(60) Provisional application No. 62/836,385, filed on Apr. 19, 2019.

(51) Int. Cl.
*H01L 21/00* (2006.01)
*H01L 21/261* (2006.01)
*H01L 29/207* (2006.01)
*H01L 29/20* (2006.01)

(52) U.S. Cl.
CPC ........ *H01L 21/261* (2013.01); *H01L 29/2003* (2013.01); *H01L 29/207* (2013.01)

(58) Field of Classification Search
CPC .. H01L 21/261; H01L 29/2003; H01L 29/207
See application file for complete search history.

(56) References Cited

U.S. PATENT DOCUMENTS

| | | | |
|---|---|---|---|
| 4,025,365 A | 5/1977 | Martin et al. | |
| 4,910,156 A * | 3/1990 | Takasu | H01L 21/263 438/501 |
| 6,114,225 A | 9/2000 | Liao et al. | |
| 2003/0134493 A1* | 7/2003 | Cho | H01L 33/32 438/522 |
| 2015/0243629 A1 | 8/2015 | Herbots et al. | |
| 2017/0179238 A1 | 6/2017 | Cheng et al. | |

OTHER PUBLICATIONS

Kuriyama, K., et al., "Lattice Distortions and the Transmuted-Ge Related Luminescence in Neutron-Transmutation-Doped GaN," 2002, Appl Phys Lett, 80/3328, Abstract Only. 1 page.
Polyakov, A.Y., et al., "Neutron Transmutation Doping Effects in GaN," 2010, J Vacuum Sci & Technol B, 28/608, Abstract Only. 1 page.
Akkoyun, S., et al., "Photonuclear Reaction Cross Sections for Gallium Isotopes," 2015, NUBA Conference Series—1: Nuclear Physics and Astrophysics, J Phys: Conference Series 590 012047, IOP Publishing Ltd., 4 pages.

(Continued)

*Primary Examiner* — Richard A Booth
(74) *Attorney, Agent, or Firm* — Stinson LLP

(57) ABSTRACT

Doped nitride-based semiconductor materials and methods of producing these materials are described herein.

19 Claims, 17 Drawing Sheets

(56) References Cited

OTHER PUBLICATIONS

Boztosun, I., et al., "Photonuclear Reactions Induces by a Clinical Linac," 2015, 2015, NUBA Conference Series—1: Nuclear Physics and Astrophysics, J Phys: Conference Series 590 012024, IOP Publishing Ltd., 6 pages.
Findlay, D.U.S., et al., "Photonuclear Transmutation Doping of Semiconductors," 1988, Semicond Sci Technol 3:388-396, 9 pages.
Kwon, J., "High Quality Doping of GaN Through Transmutation Process," Jun. 19, 2019, University of Missouri—Columbia, ARPA-e Presentation, 19 pages.
Lyons, J.L., et al., "Shedding Light on Doping of Gallium Nitride, State-of-the-Art Calculations Predict Unexpected Behavior from the Only Known p-type Dopant," Jul. 19, 2012, SPIE The International Society for Optics and Photonics, SPIE Digital Ligrary, Optics.Org, 3 pages.

* cited by examiner

| | Resistivity ($\Omega$ cm) | Mobility (cm²/(V s)) |
|---|---|---|
| C11 | 1.3823 | -0.99081 |
| C14 | 1.0967 | -275.20 |
| C16 | 1.499 | -54.146 |
| C17 | 1.061 | 250.999 |
| C18 | 0.8457 | -30.5805 |
| C19 | 1.087 | 45.1495 |

Table 1

| | Resistivity ($\Omega$ cm) | Mobility (cm²/(V s)) |
|---|---|---|
| C11 | 0.366 | -405.657 |
| C14 | 0.217 | -391.52 |
| C16 | 0.168 | -398.217 |
| C17 | 0.245 | -376.767 |
| C18 | 0.119 | -409.407 |
| C19 | 0.231 | -404.393 |

Table 2

| | B | C | E | F | G | H |
|---|---|---|---|---|---|---|
| Resistivity ($\Omega$cm) | 1.036 | 1.305 | 1.118 | 1.159 | 1.219 | 1.328 |
| Carrier Con. ($Cm^{-3}$) | 5.61 e16 | 3.24 e16 | 1.51 e16 | 9.46 e16 | 1.45e16 | 7.09 e16 |
| Mobility ($cm^2$/(Vs)) | 107.414 | 147.598 | 369.474 | 56.932 | 352.64 | 66.307 |

Table 3

LOW DEFECT NUCLEAR TRANSMUTATION DOPING IN NITRIDE-BASED SEMICONDUCTOR MATERIALS

CROSS REFERENCE TO RELATED APPLICATIONS

This application claims the benefit of U.S. Provisional Patent Application No. 62/836,385, filed Apr. 20, 2019, the entirety of which is incorporated herein by reference.

GOVERNMENT RIGHTS

This invention was made with government support under DE-AR0000874 awarded by the Department of Energy (DOE). The government has certain rights in the invention.

FIELD

The present invention relates to various doped nitride-based semiconductor materials and methods of producing these materials.

BACKGROUND

Gallium Nitride (GaN) neutron transformation doping processes have been studied in the past by researchers. Generally, such studies encountered issues with high resistivity and electron traps formed during the irradiation process. Previous attempts have conducted the neutron irradiation in high flux areas with a low ratio of thermal to fast neutrons, such as 1:1 for A. Y. Polyakov, N. B. Smirnov, A. V. Govorkov, in Journal of Vacuum Science & Technology B, Nanotechnology and Microelectronics: Materials, Processing, Measurement, and Phenomena 28, 608 (2010), and 2:1 for K. Kuriyama, T. Tokumasu, Jun Takahashi, H. Kondo in Appl. Phys. Lett. 80, 3328 (2002). This approach led to extensive radiation damage of the wafers. Thus, there remains a need for methods of producing doped nitride-based semiconductor material where defects from radiation are effectively reduced.

SUMMARY

Various aspects of the present invention are directed to methods of producing a doped nitride-based semiconductor material. In some embodiments, the method comprises: emitting an initial stream of neutron irradiation comprising thermal flux, epithermal flux, and fast neutron flux toward a nitride-based semiconductor workpiece in a nuclear reactor; reducing a density of fast neutron flux and/or thermal neutron flux in the initial stream of neutron irradiation to produce a modulated stream of neutron irradiation, wherein the modulated stream of neutron irradiation has: a ratio of epithermal flux density to fast neutron flux density that is greater than a ratio of epithermal flux density to fast neutron flux density in the initial stream of neutron irradiation and/or a ratio of epithermal flux density to thermal neutron flux density that is greater than a ratio of epithermal flux density to thermal neutron flux density in the initial stream of neutron irradiation; and bombarding the workpiece with the modulated stream of neutron irradiation to effect transmuting a proportion of a first element in the workpiece to a second element to produce the doped nitride-based semiconductor material.

In further embodiments, the method comprises bombarding a nitride-based semiconductor workpiece with a stream of neutron irradiation in a nuclear reactor to effect transmuting a proportion of a first element in the workpiece to a second element to produce the doped nitride-based semiconductor material, wherein the neutron irradiation comprises a thermal flux, epithermal flux, and fast neutron flux; and wherein the stream of neutron irradiation reaching the workpiece has a ratio of epithermal neutron flux density to fast neutron flux density that is about 1:1000 or greater, about 1:500 or greater, about 1:100 or greater, or about 1:10 or greater.

In various embodiments, the method comprises: positioning a nitride-based semiconductor workpiece in a zone of a nuclear reactor that has a preferentially greater ratio of an epithermal flux density to a fast neutron flux density based on a map of relative flux densities in the reactor; and bombarding the workpiece with a stream of neutron irradiation in the zone of the nuclear reactor to effect transmuting a proportion of a first element in the workpiece to a second element to produce the doped nitride-based semiconductor material.

Further aspects of the present invention are directed to doped nitride-based semiconductor materials. In some embodiments, the doped nitride-based semiconductor material comprises a metal nitride comprising at least one metal selected from the group consisting of Al, Ga, In, and combinations thereof, a dopant; and $^{14}C$. In some embodiments, the average concentration of $^{14}C$ is about $5\times10^{16}$ atoms/cm$^3$ of the material or less.

This summary is provided merely for purposes of summarizing various example embodiments of the present disclosure so as to provide a basic understanding of various aspects of the teachings herein. Various embodiments, aspects, and advantages will become apparent from the following detailed description taken in conjunction with the accompanying drawings which illustrate, by way of example, the principles of the described embodiments. Accordingly, it should be understood that the description and specific examples set forth herein are intended for purposes of illustration only and are not intended to limit the scope of the present teachings.

DRAWINGS

The drawings described herein are for illustration purposes only and are not intended to limit the scope of the present teachings in any way.

Figure 3:
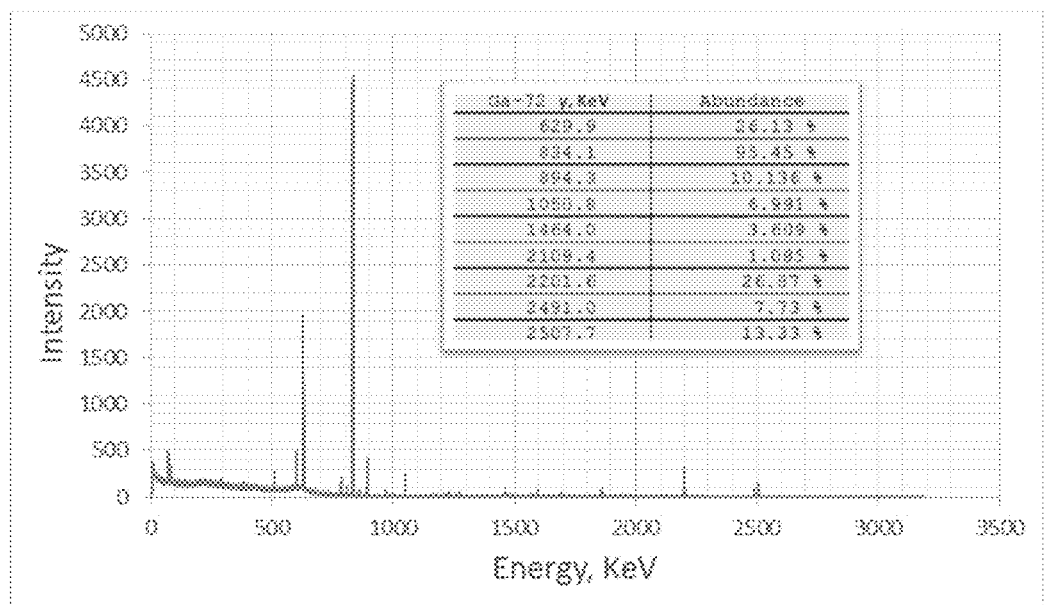

FIG. 3 exemplarily illustrates gamma ray counts from the irradiated wafers, in accordance with various embodiments of the present disclosure.

FIG. 3A provides a Table 1 illustrating the resistivity and mobility for the unannealed $10^{17}$ Ge atoms/cm$^3$ samples at 100° C., and a Table 2 illustrating the resistivity and mobility for the annealed $10^{17}$ Ge atoms/cm$^3$ samples, wherein all measurements were taken at room temperature, in accordance with various embodiments of the present disclosure.

FIG. 3B provide a Table 3 illustrating Hall measurement data of irradiated GaN samples with Au epoxy contact, in accordance with various embodiments of the present disclosure.

Figure 4:
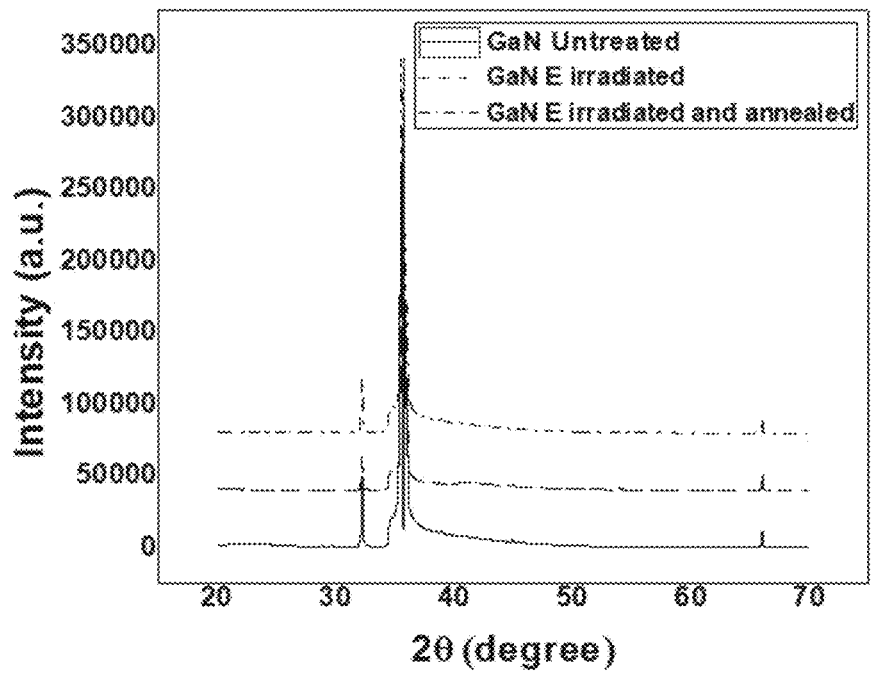

FIG. 4 exemplarily illustrates the XRD data of the untreated control, irradiated, and irradiated & annealed samples, in accordance with various embodiments of the present disclosure.

Figure 5:
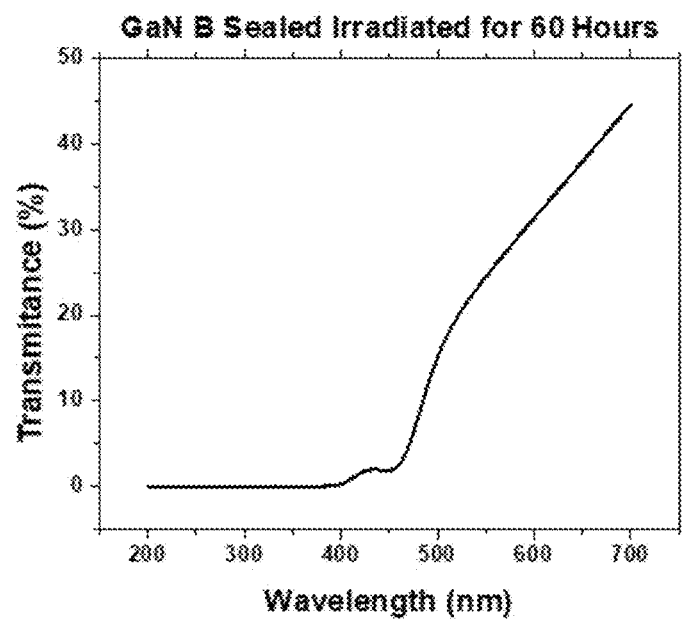

FIG. 5 exemplarily illustrates a UV-Vis spectra of the irradiated GaN B wafer in a sealed container for 60 hours, in accordance with various embodiments of the present disclosure.

Figure 6:
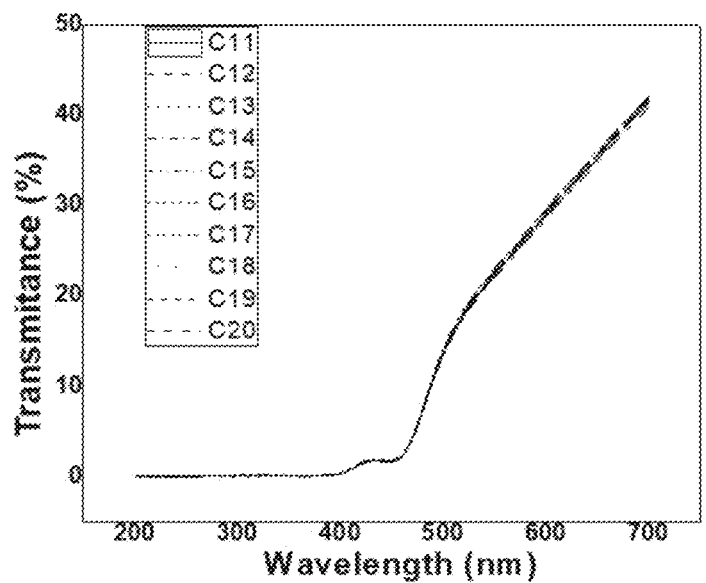

FIG. 6 exemplarily illustrates a UV-Vis spectra of the irradiated GaN C samples in a sealed container for 60 hours, in accordance with various embodiments of the present disclosure.

Figure 7:
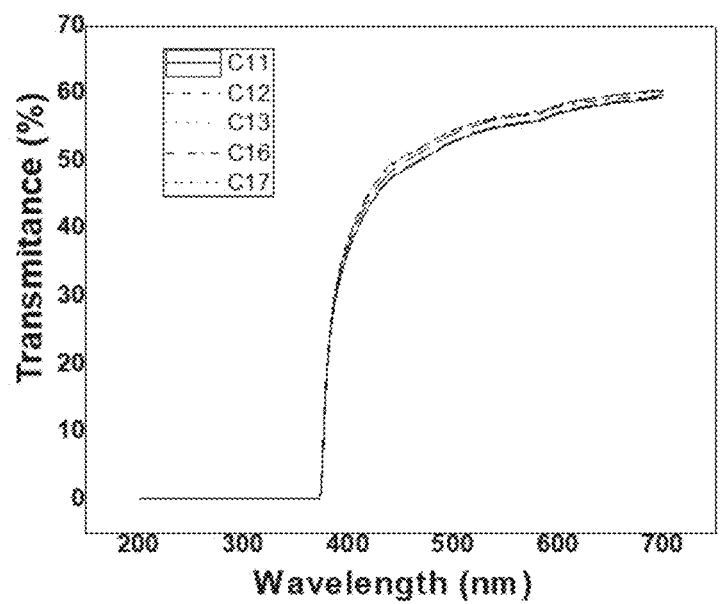

FIG. 7 exemplarily illustrates UV-Vis spectra of the 5 best GaN samples which were irradiated and annealed, in accordance with various embodiments of the present disclosure.

Figure 8:
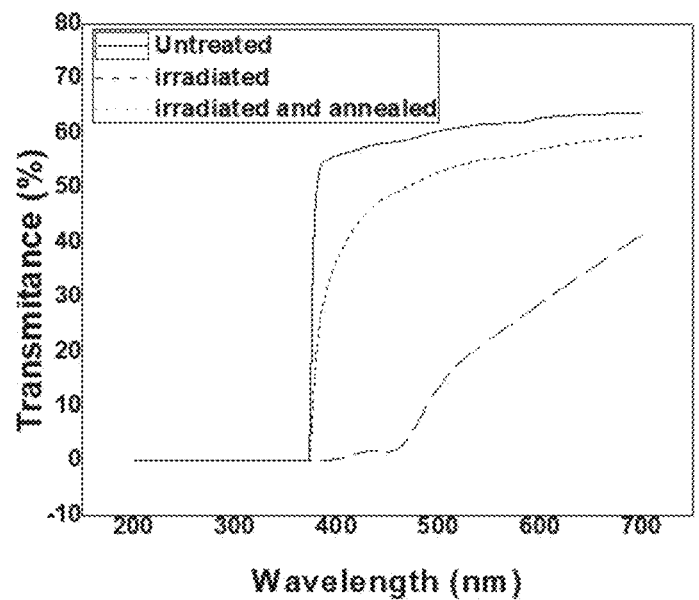

FIG. 8 exemplarily illustrates a UV-Vis spectra of GaN C11 sample after irradiating and after annealing process, in accordance with various embodiments of the present disclosure.

Figure 9:
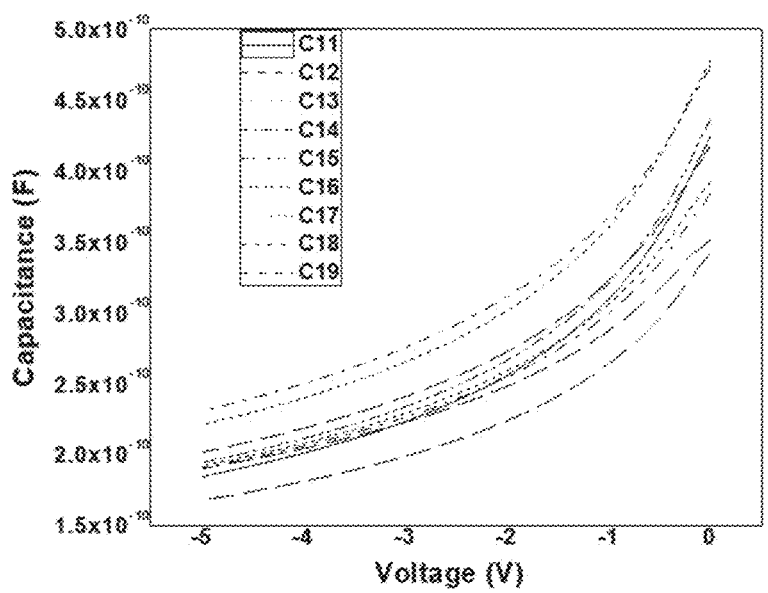

FIG. 9 exemplarily illustrates C-V measurement of GaN C sample after the irradiating and annealing process, in accordance with various embodiments of the present disclosure.

FIG. 10 exemplarily illustrates a $1/C^2$ plot of GaN C11 sample after the irradiating process and after the annealing process, in accordance with various embodiments of the present disclosure.

Figure 11:
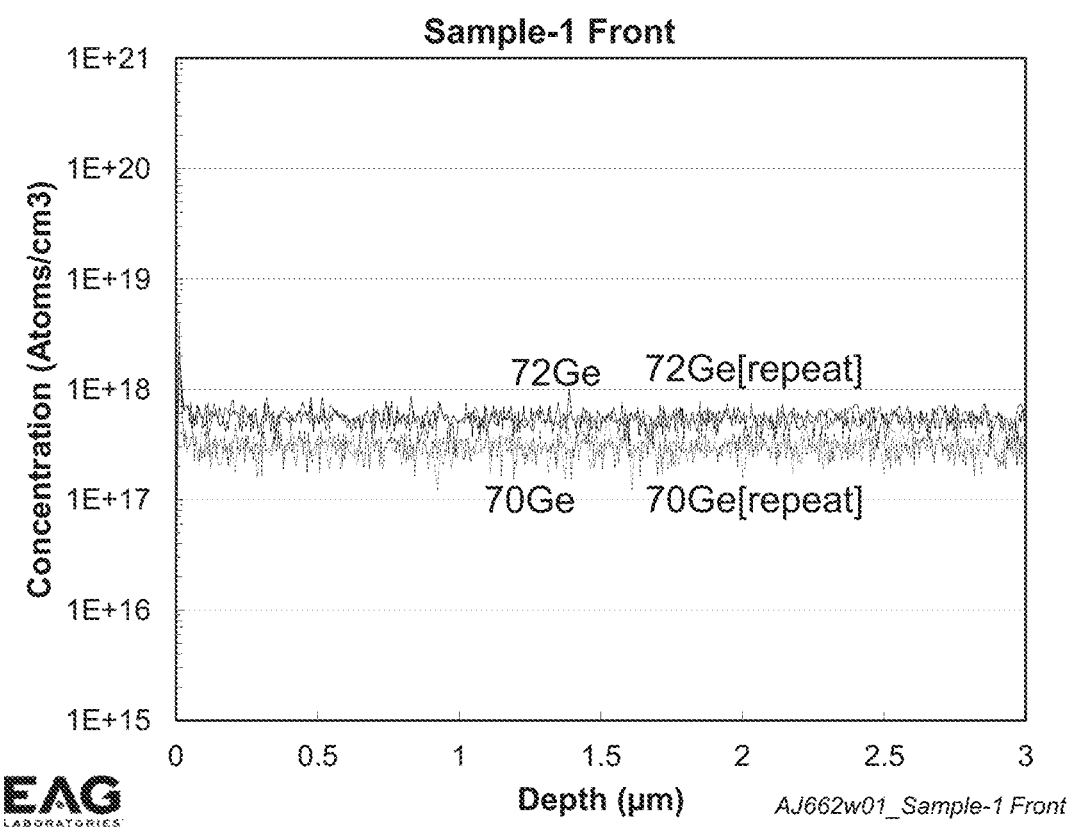

FIG. 11 exemplarily illustrates a SIMS depth profile on the front of the $10^{18}$ Ge atoms/cm$^3$ concentration GaN wafer, in accordance with various embodiments of the present disclosure.

Figure 12:
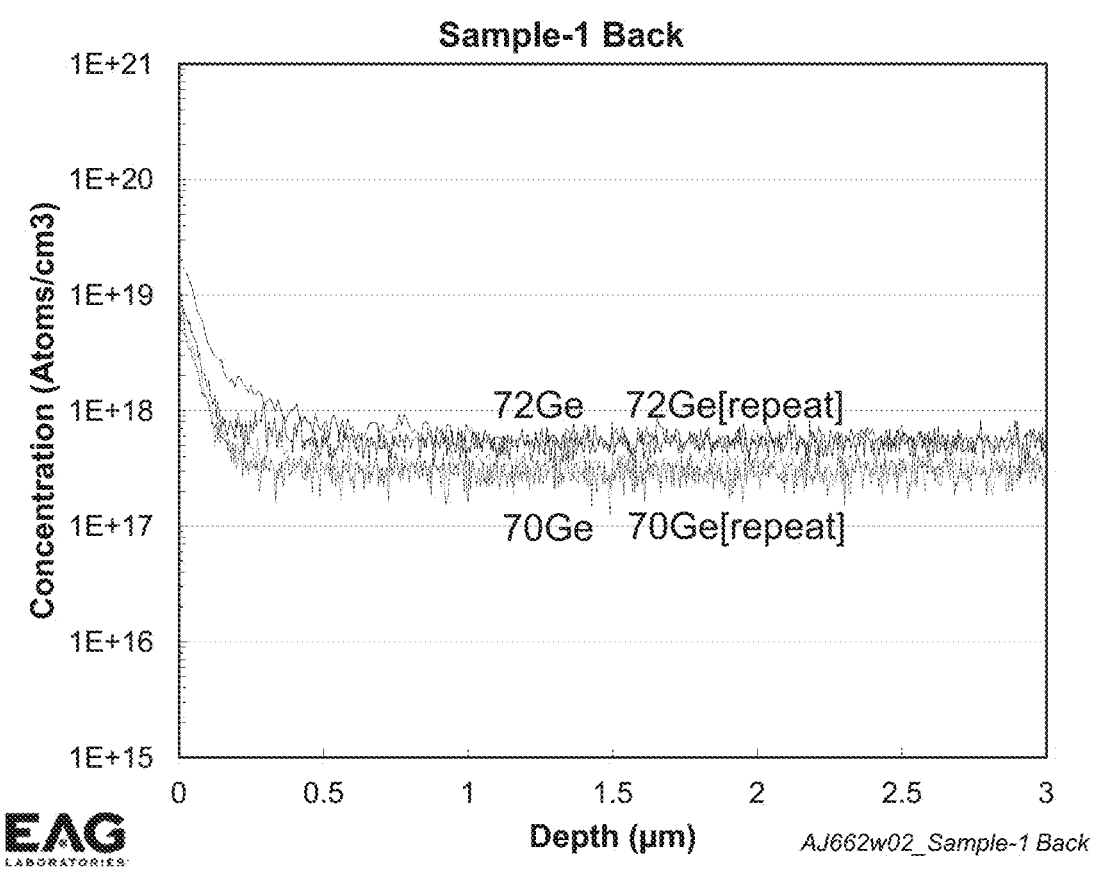

FIG. 12 exemplarily illustrates a SIMS depth profile on the back of the $10^{18}$ Ge atoms/cm$^3$ concentration GaN wafer, in accordance with various embodiments of the present disclosure.

Figure 13A:
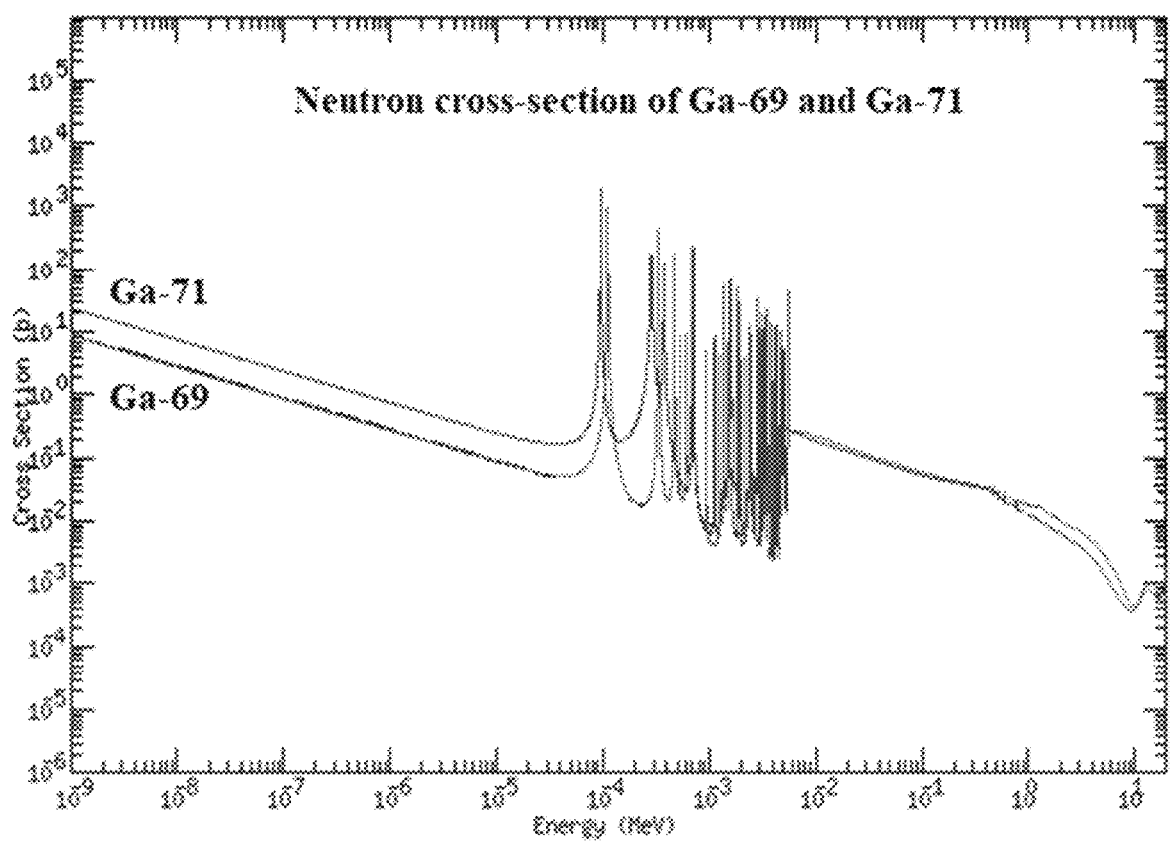

FIG. 13A presents a graph of cross sections for the (n,γ) reactions for $^{69}$Ga and $^{71}$Ga.

Figure 13B:
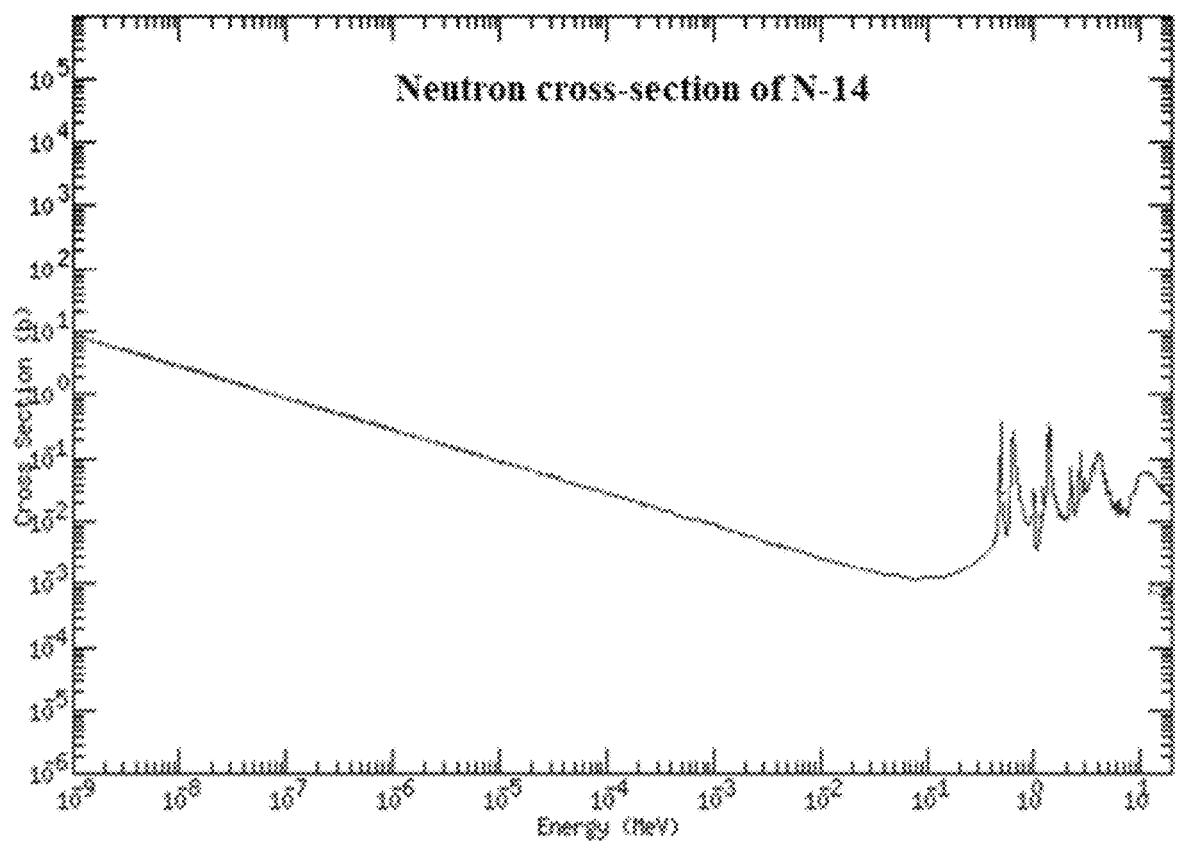

FIG. 13B presents a graph of cross section of (n,p) reaction for $^{14}$N.

Figure 14:
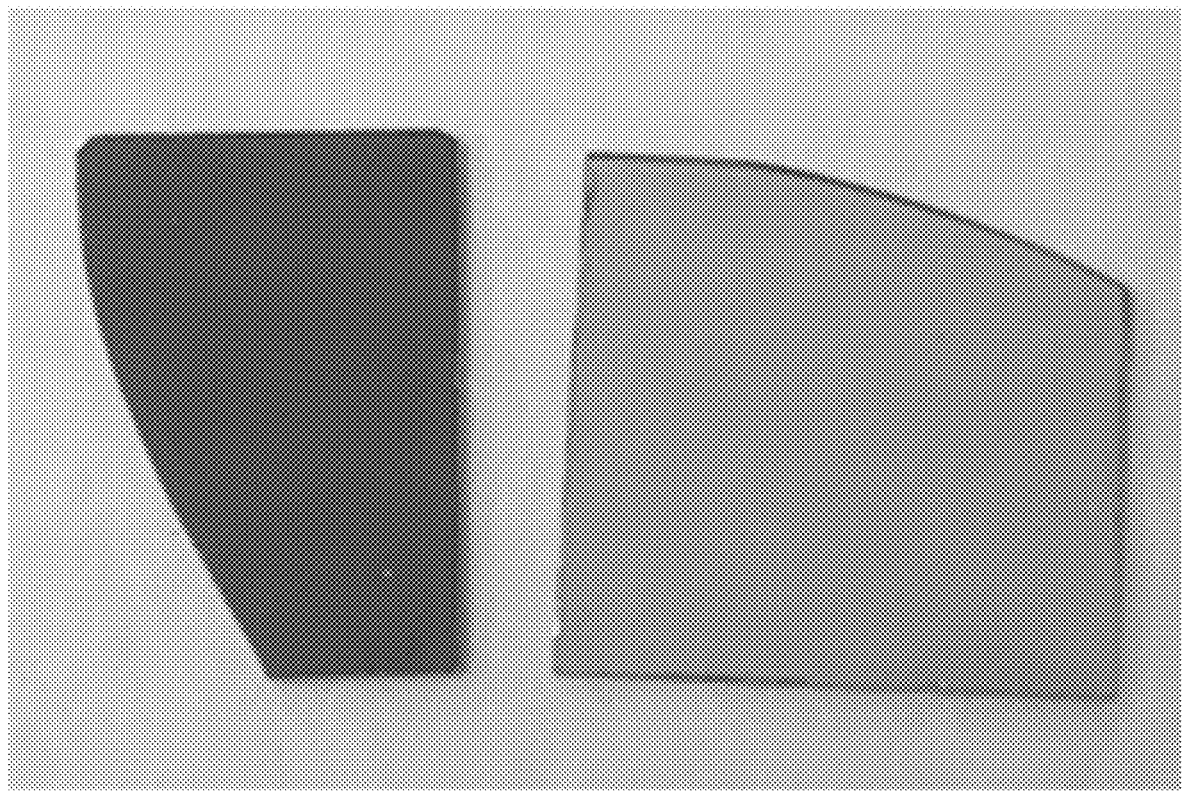

FIG. 14 presents (from left to right) an unannealed sample irradiated using the old location in the nuclear reactor and a sample irradiated in the sealed container in the Topaz location of the reactor.

Figure 15:
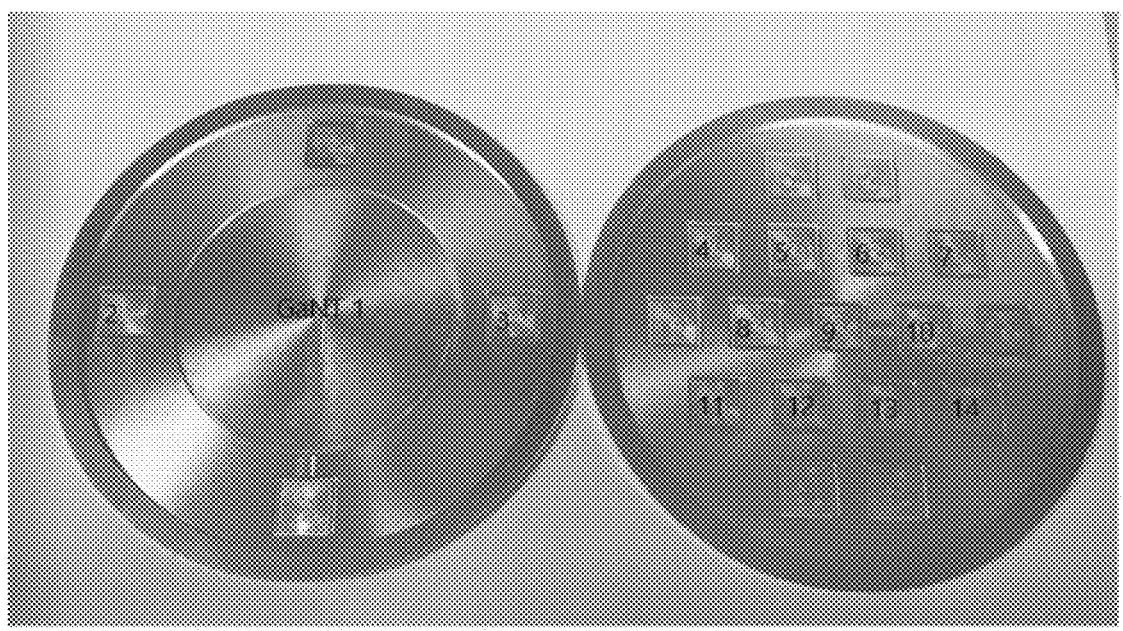

FIG. 15 presents an image of containers and positions of the Topaz irradiated samples.

Figure 16:
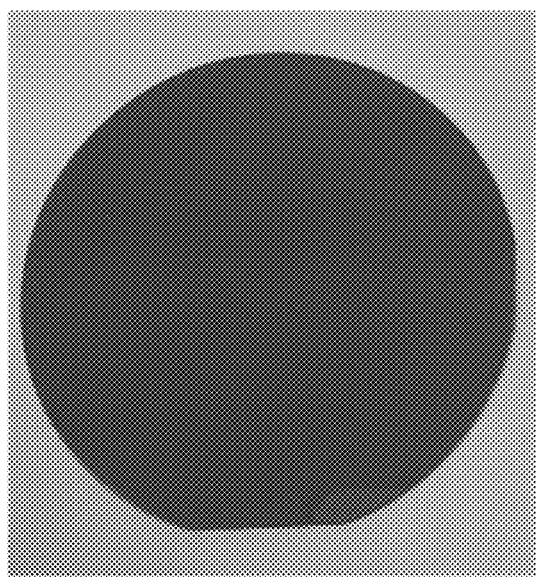

FIG. 16 presents an image of a GaNT 1 after irradiation but before annealing.

Figure 17:
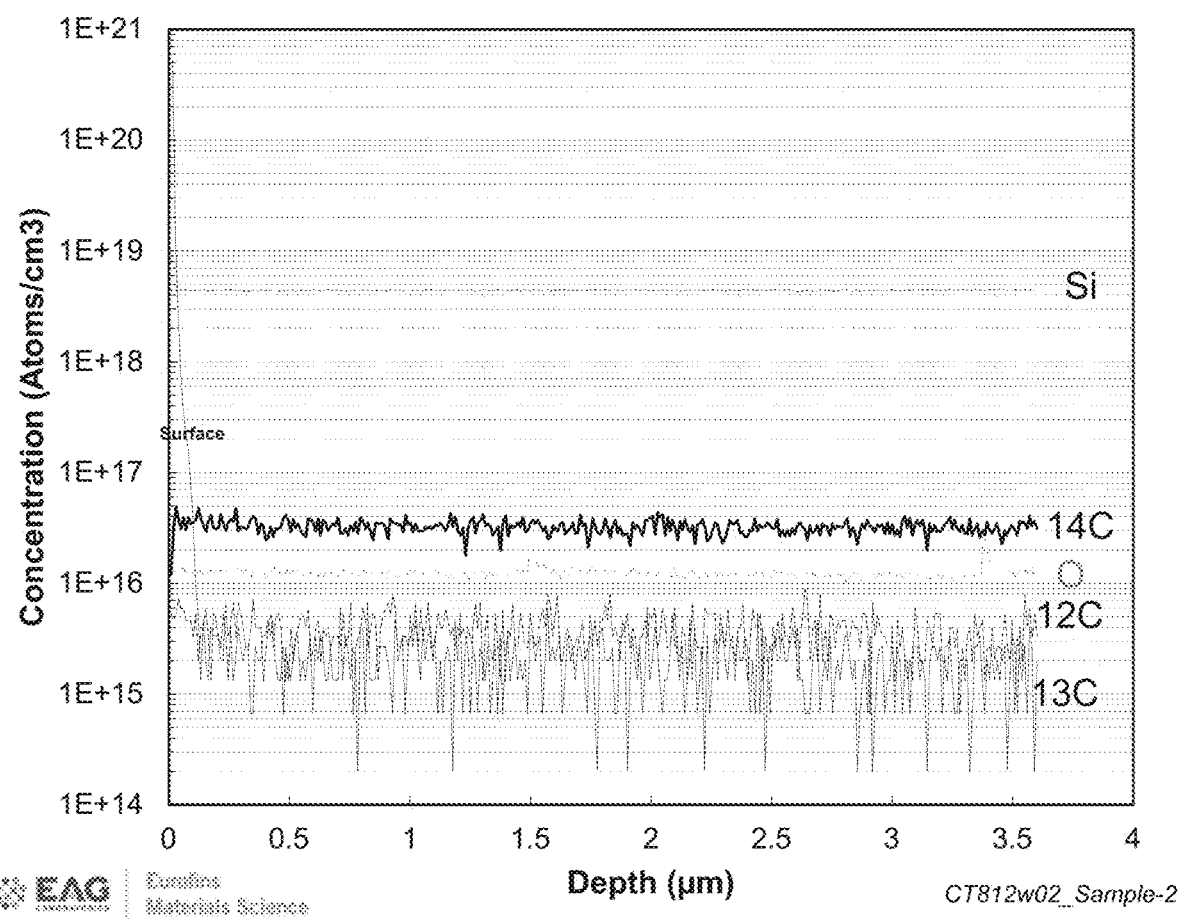

FIG. 17 presents the results of SIMS measurement for the $^{14}$C concentration (solid line) of GaN wafer irradiated with thermal neutron with the Ge doping concentration of $10^{17}$ cm$^{-1}$.

Figure 18:
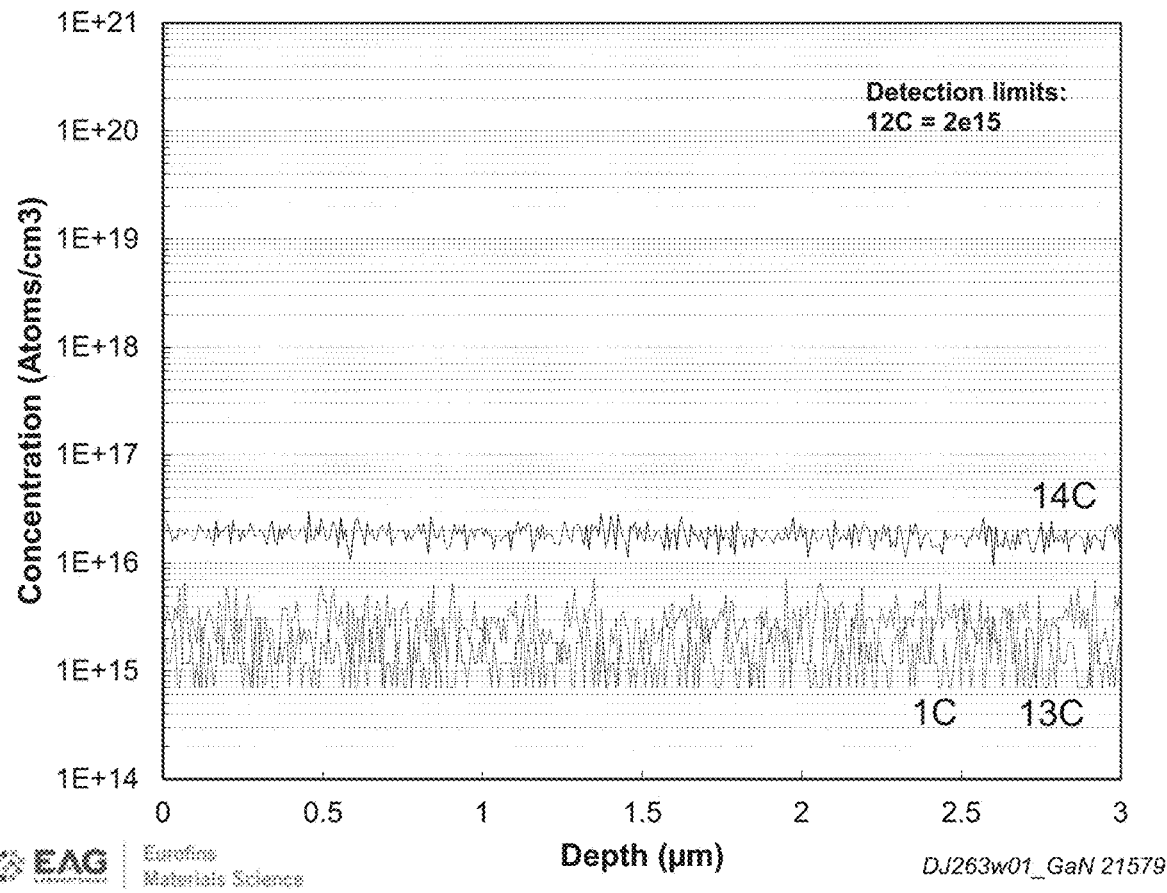

FIG. 18 presents the results of SIMS measurement for the $^{14}$C concentration (solid line) of GaN wafer irradiated in the Topaz location with the Ge doping concentration of $10^{17}$ cm$^{-1}$.

Figure 19:
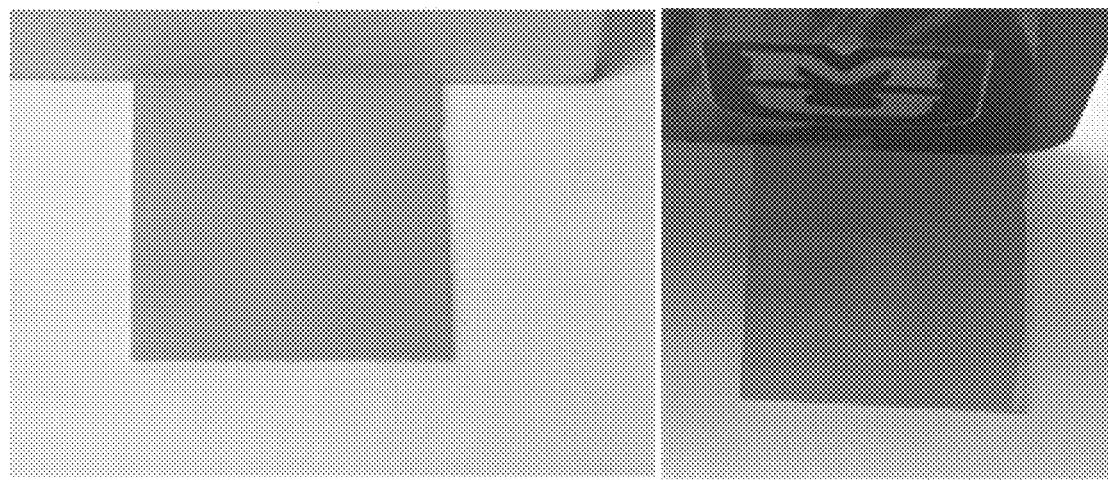

FIG. 19 presents images of an annealed sample. On the left, the sample is on a white background with a white backdrop to ensure no unwanted reflections. On the right, the same sample photographed on a white background with a picture backdrop to show the mirror quality of the surface.

Figure 20:
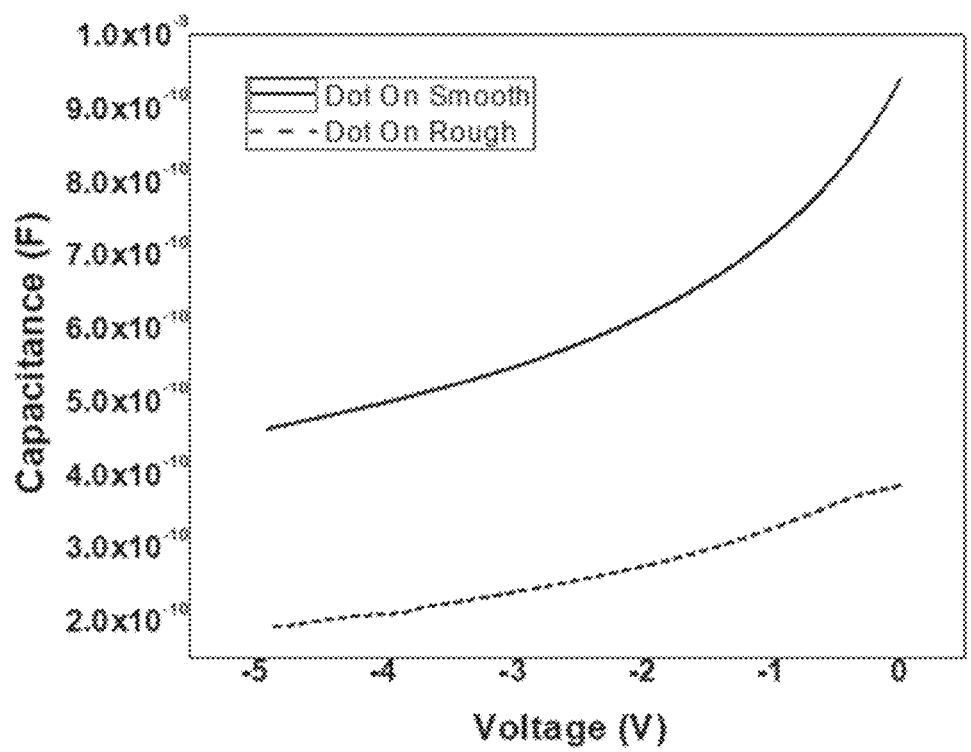

FIG. 20 presents the C-V curve of the annealed sample irradiated in area B.

Figure 21:
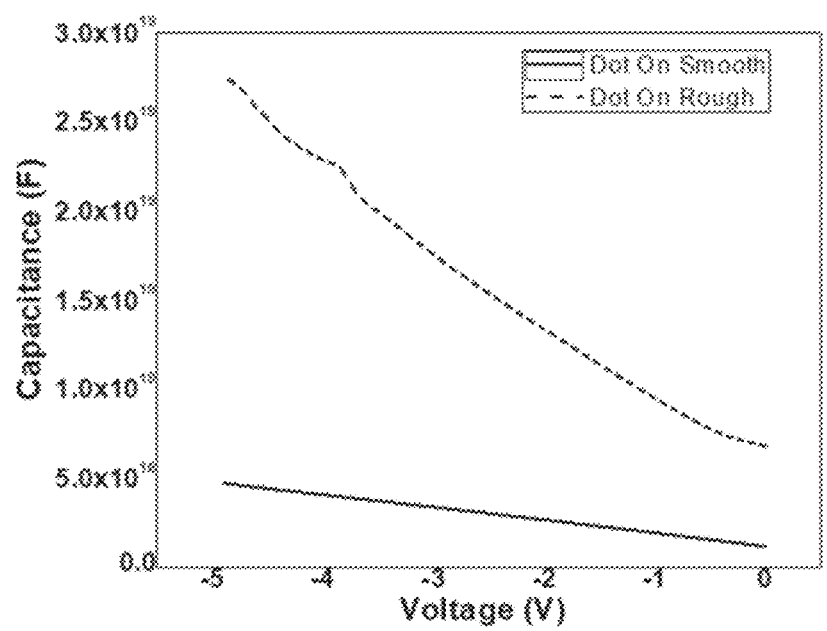

FIG. 21 present the $1/C^2$-V curves of the two measurement configurations.

Figure 22:
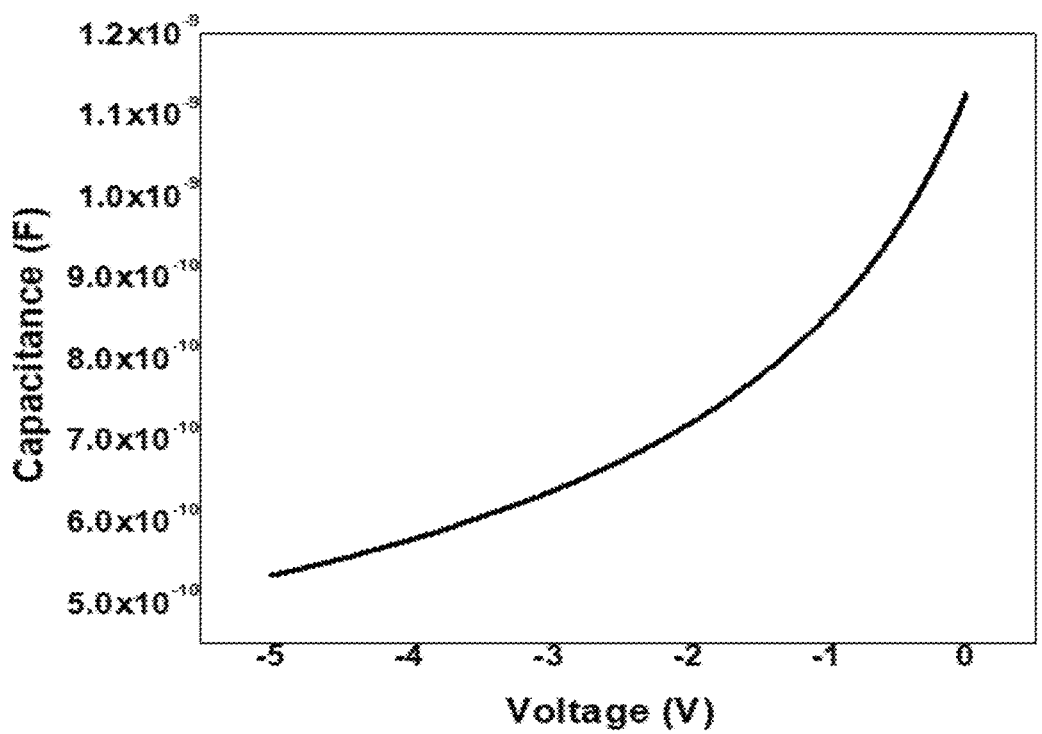

FIG. 22 presents the C-V curve of the annealed sample irradiated in area B using mercury dot and ring electrodes on the smooth surface.

Figure 23:
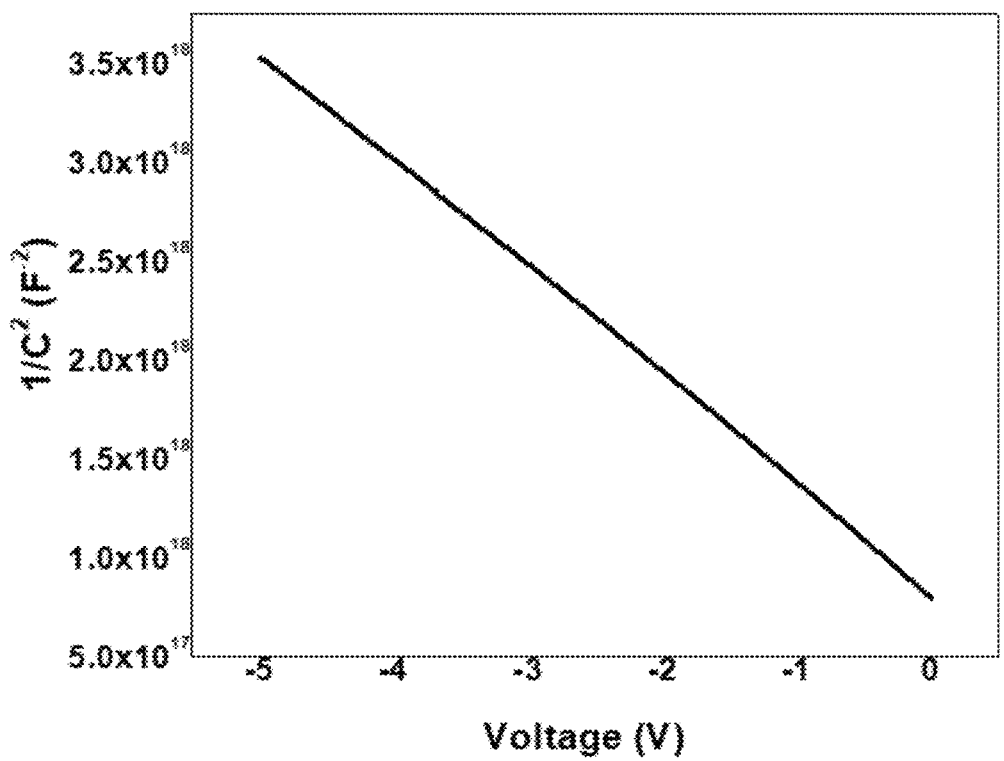

FIG. 23 presents the $1/C^2$-V curves of the annealed sample irradiated in area B using mercury dot and ring electrodes on the smooth surface.

Corresponding reference numerals indicate corresponding parts throughout the several views of drawings.

DETAILED DESCRIPTION

One of the most damaging and irreversible defects in the production of doped nitride-based semiconductor material is 14C, which is produced through the nuclear reaction $N^{14}$(n, p)$C^{14}$. $^{14}$C not only negatively impacts the electrical properties of the material (e.g., doped GaN wafers), it is also a radioactive material with a long half-life, which further degrades the quality of the semiconductor over time and requires special handling. Minimizing the $^{14}$C concentration would significantly improve the quality of doped nitride-based semiconductor materials such as doped GaN wafers. The cross section or probability of this reaction to occur is maximal at low (or thermal) neutron energy. For example, the nuclear reactions $^{69}$Ga(n,γ)$^{70}$Ga and $^{71}$Ga(n,γ)$^{72}$Ga have a significant probability of occurring at slightly higher neutron energies than thermal neutron. The neutrons at this energy level (0.5 eV to 0.1 MeV) are called epithermal neutrons. In contrast, it is believed that $^{14}$C defects (resulting in high resistivity and electron traps) are caused at least in part by fast neutrons. Hence shielding a nitride-based semiconductor workpiece (e.g., GaN) from fast neutrons or reducing fast neutron flux is believed to reduce the amount of $^{14}$C produced while not greatly impacting the production of dopant(s) (e.g., $^{70}$Ga and $^{72}$Ga, and hence $^{70}$Ge and $^{72}$Ge).

Applicants have discovered various strategies for achieving this shielding and/or reducing the conversion of $^{14}$N to $^{14}$C. Accordingly, in various embodiments, systems and methods are provided to achieve high quality nitride-based semiconductor materials (e.g., N-type doping GaN wafers or ingots or other nitride based semiconductor materials such as aluminum nitride) by significantly reducing the irradiation damage cause by fast neutron flux and optionally thermal neutron flux. In some embodiments, methods for producing a doped nitride-based semiconductor material comprise emitting an initial stream of neutron irradiation comprising thermal flux, epithermal flux, and fast neutron flux toward a nitride-based semiconductor workpiece in a nuclear reactor; reducing a density of fast neutron flux and/or thermal neutron flux in the initial stream of neutron irradiation to produce a modulated stream of neutron irradiation, wherein the modulated stream of neutron irradiation has: a ratio of epithermal flux density to fast neutron flux density that is greater than a ratio of epithermal flux density to fast neutron flux density in the initial stream of neutron irradiation and/or a ratio of epithermal flux density to thermal neutron flux density that is greater than a ratio of epithermal flux density to thermal neutron flux density in the initial stream of neutron irradiation; and bombarding the workpiece with the modulated stream of neutron irradiation to effect transmuting a proportion of a first element in the workpiece to a second element to produce the doped nitride-based semiconductor material.

In further embodiments, methods for producing a doped nitride-based semiconductor material comprise bombarding a nitride-based semiconductor workpiece with a stream of neutron irradiation in a nuclear reactor to effect transmuting a proportion of a first element in the workpiece to a second element to produce the doped nitride-based semiconductor material, wherein the neutron irradiation comprises a thermal flux, epithermal flux, and fast neutron flux; and wherein the stream of neutron irradiation reaching the workpiece has a ratio of epithermal neutron flux density to fast neutron flux density that is about 1:1000 or greater, about 1:500 or greater, about 1:100 or greater, or about 1:10 or greater.

One strategy applicants have discovered that is particularly effective for reducing the conversion of $^{14}$N to $^{14}$C is by positioning the semiconductor workpiece in a zone of a nuclear reactor that has a preferentially greater ratio of epithermal flux density to fast neutron flux density based on a map of relative flux densities in the reactor. For example, a GaN workpiece can be placed in a special region of the reactor with a neutron spectrum lower in the thermal neutron and fast neutron while maintaining epithermal neutrons. An area or zone in a reactor is selected where the fast neutron flux and, optionally, thermal neutron flux are minimized and the epithermal neutron flux is maximized.

Accordingly, in some embodiments, methods for producing a doped nitride-based semiconductor material comprise positioning a nitride-based semiconductor workpiece in a zone of a nuclear reactor that has a preferentially greater ratio of an epithermal flux density to a fast neutron flux density based on a map of relative flux densities in the reactor; and bombarding the workpiece with a stream of neutron irradiation in the zone of the nuclear reactor to effect transmuting a proportion of a first element in the workpiece to a second element to produce the doped nitride-based semiconductor material.

A further strategy applicants have discovered that is also particularly effective in reducing the conversion of $^{14}$N to $^{14}$C is introducing a neutron absorber to the nuclear reactor to reduce the density of the fast neutron flux and/or thermal neutron flux in the stream of neutron irradiation (or initial stream of neutron irradiation). Neutron absorber materials include, for example, at least one element selected from the group consisting of boron, titanium, cobalt, molybdenum, cadmium, indium, hafnium, samarium, europium, gadolinium, dysprosium, erbium, ytterbium, and combinations thereof. In some embodiments, the neutron absorber material comprises at least one element selected from the group consisting of boron, cadmium, hafnium, and combinations thereof. In certain embodiments, the neutron absorber material is used to reduce the density of thermal neutron flux.

In various embodiments, the workpiece is held in a container comprising the neutron absorber material. For example, a GaN workpiece can be encased with a neutron absorber like B, Cd, etc. The surface of the GaN workpiece is well protected during the doping process by placing the workpiece in a sealed container constructed of the neutron absorber material.

In some embodiments, a combination of strategies are used. In certain embodiments, the methods described herein can comprise positioning the workpiece in a zone of a nuclear reactor that has a preferentially greater ratio of epithermal flux density to fast neutron flux density based on a map of relative flux densities in the reactor and introducing a neutron absorber material to the nuclear reactor to reduce the density of the fast neutron flux and/or thermal neutron flux in the stream of neutron irradiation.

Figure 1:
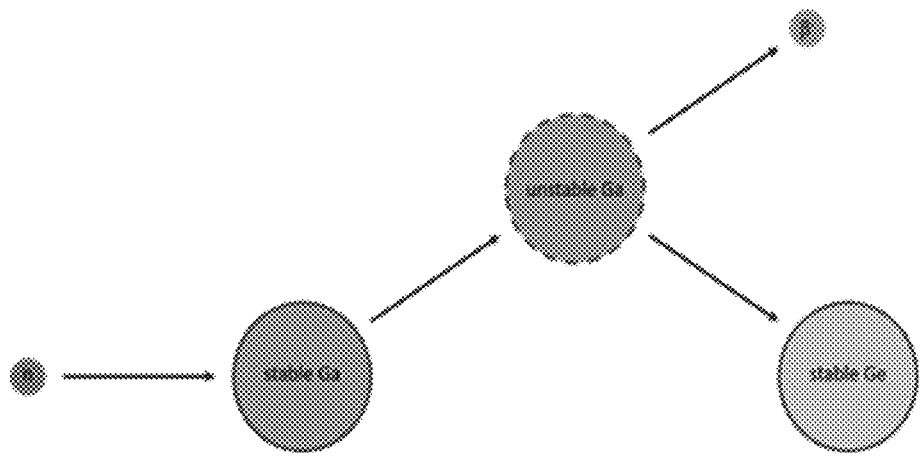
FIG. 1 is an illustration of a Ga neutron transmutation process, in accordance with various embodiments of the present disclosure.

For example, referring to the FIG. 1, a method for doping GaN wafers can comprise placing the GaN wafers in a sealed canister prior to irradiating the GaN wavers with a neutron flux. The sealed canister prevents water from contaminating the sample surface. Next, the GaN wafers can be irradiated with an epithermal neutron flux in a selected area at the reactor that is identified to have minimal fast neutron flux and, optionally, minimal thermal flux. When GaN is under neutron bombardment, the two stable Ga isotopes capture a neutron via the nuclear reactions $^{69}$Ga(n,γ)$^{70}$Ga and $^{71}$Ga(n,γ)$^{72}$Ga. The isotope $^{70}$Ga decays by beta emission with a branching ratio of 99.59% and a half-life of 21.14 minutes, producing stable $^{70}$Ge. The isotope $^{72}$Ga decays by beta emission with a branching ratio of 100% and a half-life of 14.1 hours, producing stable $^{72}$Ge. Under various thermal neutron flux conditions, different qualities of doping can be achieved.

In accordance with various embodiments described herein, the stream of neutron irradiation reaching the workpiece can have an enhanced ratio of epithermal neutron flux density to fast neutron flux density (e.g., a ratio of epithermal neutron flux density to fast neutron flux density that is about 1:1000 or greater, about 1:500 or greater, about 1:100 or greater, or about 1:10 or greater). In some embodiments, the ratio of epithermal neutron flux density to fast neutron flux density is of from about 1:1000 to about 1:1. In certain embodiments, an accelerator based epithermal neutron beam can be used to create zero or substantially near zero fast neutrons.

The strategies employed herein to reduce fast neutron flux can also be used to reduce thermal neutron flux. Accordingly, in various embodiments, the methods described herein can further comprise reducing a density of thermal neutron flux in the stream of neutron irradiation (or initial stream of neutron irradiation). In some embodiments, the stream of neutron irradiation (or modulated stream of neutron irradiation) has a ratio of epithermal flux density to thermal flux density that is greater than a ratio of epithermal flux density to thermal flux density in the initial stream of neutron irradiation. In certain embodiments, the stream of neutron irradiation (or modulated stream of neutron irradiation) has a ratio of epithermal flux density to thermal flux density that is about 0.1:1 or greater, about 0.5:1 or greater, about 1:1 or greater, or about 2:1 or greater.

As noted, methods of producing a doped nitride-based semiconductor material comprise bombarding a workpiece with stream of neutron irradiation in the zone of the nuclear reactor to effect transmuting a proportion of a first element in the workpiece to a second element to produce the doped nitride-based semiconductor material. Although, the methods described herein seek to minimize generation of $^{14}$C, one transmutation is $^{14}$N to $^{14}$C (i.e., the first element can comprise $^{14}$N and the second element can comprise $^{14}$C). In some embodiments, the average concentration of $^{14}$C is about 5×10$^{16}$ atoms/cm$^3$ of the material or less. In certain embodiments, the average concentration of $^{14}$C is about 2×10$^{16}$ atoms/cm$^3$ of the material or less.

In various embodiments, the workpiece comprises at least one metal selected from the group consisting of Al, Ga, In, and combinations thereof. In some embodiments, the workpiece comprises Ga. In certain embodiments, the workpiece is a GaN semiconductor workpiece. Accordingly, in embodiments where the workpiece comprises Ga, the transmuting comprises transmuting a quantity of Ga to Ge. In some embodiments, the average concentration of the Ge is about 1×10$^{17}$ atoms/cm$^3$ of the material or greater. In certain embodiments, the average concentration of the Ge is from about 1×10$^{17}$ atoms/cm$^3$ to about 2×10$^{17}$ atoms/cm$^3$ of the material. In various embodiments, the transmuting comprises transmuting a quantity of Ga to Ge and $^{14}$N to $^{14}$C, wherein the molar ratio of Ge to $^{14}$C is about 1.5:1 or greater, about 5:1 or greater, or about 10:1 or greater.

Various methods described herein can further comprise annealing the doped nitride-based semiconductor material. For example, after irradiation doped nitride-based semiconductor materials (e.g., GaN wafers) can be annealed at high temperature to reverse damage some done during the irradiation step. The results can meet industry standard for different applications such as power semiconductors, etc.

The present invention is also directed to doped nitride-based semiconductor materials, including those produced by the methods described herein. In various embodiments, doped nitride-based semiconductor materials comprise a metal nitride comprising at least one metal selected from the group consisting of Al, Ga, In, and combinations thereof; a dopant; and $^{14}C$. In some embodiments, the average concentration of $^{14}C$ is about $5 \times 10^{16}$ atoms/cm$^3$ of the material or less. In some embodiments, the average concentration of $^{14}C$ is about $2 \times 10^{16}$ atoms/cm$^3$ of the material or less.

In certain embodiments, metal nitride comprises Ga and the dopant comprises Ge. In some embodiments, the average concentration of the Ge is about $1 \times 10^{17}$ atoms/cm$^3$ of the material or greater. For example, the average concentration of the Ge can be from about $1 \times 10^{17}$ atoms/cm$^3$ to about $2 \times 10^{18}$ atoms/cm$^3$ of the material. In further embodiments, the molar ratio of Ge to $^{14}C$ is about 1.5:1 or greater, about 5:1 or greater, or about 10:1 or greater.

EXAMPLES

The following non-limiting examples are provided to further illustrate the present invention.

Example 1

Figure 2:
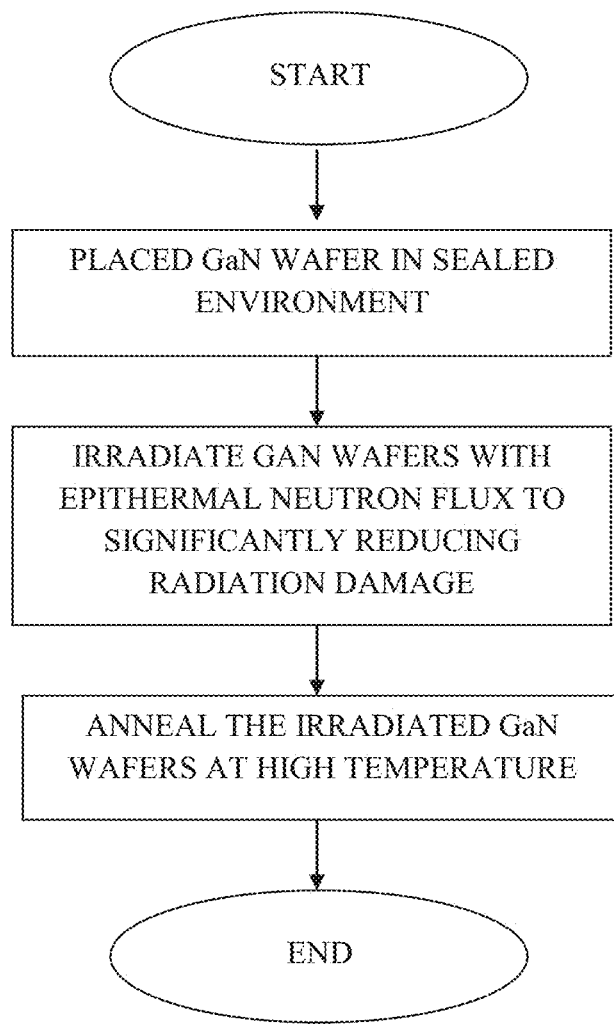
FIG. 2 is a flow chart exemplarily illustrating the high quality nuclear transmutation doping process of GaN shown in FIG. 1, in accordance with various embodiments of the present disclosure.

GaN wafers were irradiated in an area with high thermal and epithermal neutron flux compared to fast neutron flux ratio. To achieve a doping concentration of $10^{16}$ Ge atoms/cm$^3$, the wafers were irradiated for 4 hours. To achieve a doping concentration of $10^{17}$ Ge atoms/cm$^3$, the wafers were irradiated for 60 hours. The $10^{18}$ Ge atoms/cm$^3$ wafers were created after 600 hours of irradiation. In order to remove the discoloration and defects in the GaN wafer, the wafers were annealed at high temperature. The annealing process was 15 minutes long at 950° C. in a pressurized nitrogen environment. The nitrogen environment was necessary to prevent the nitrogen on the surface of the GaN from degrading away. FIG. 2 is the flow chart of the high-quality neutron transmutation doping process of GaN.

To measure the Ge concentration in the GaN wafers, the wafers were put into a beryllium gamma-ray counting machine. Each gamma ray represents a decay of a $^{72}Ga$ atom ($^{70}Ga$ also decays this way but at a much faster rate. Before it is safe to measure the Ga-72 amount all of the 7° Ga has decayed away). Once current activity of the $^{72}Ga$ was calculated, the end of irradiation activity was calculated, which will give the amount of $^{72}Ge$ and $^{70}Ge$ created in the wafers. FIG. 3 shows the gamma ray counts from the irradiated wafers with a table showing the possible gamma rays produced by $^{72}Ga$ along with the percentage chance that specific energy occurs.

Aluminum contacts were coated on the GaN wafers for Hall Effect measurements. The measurement results of the unannealed and annealed measurements of the $10^{17}$ Ge atoms/cm$^3$ samples are presented in Tables 1 and 2, respectively, of FIG. 3A. These wafers were 1×1 cm samples which were diced from the same 2-inch wafer. The unannealed wafers still exhibited some damage which results in variable mobility data. The resistivity of these unannealed wafer is in the range of 1 Ωcm.

For the annealed samples, the measurements were taken at room temperature. Overall, the resistivity of the samples went down while the mobility went up. The mobility measurements of the annealed wafers were much more consistent compared to the unannealed wafer.

Referring to FIG. 3B, in various instances, Hall measurement results of irradiated GaN samples with gold epoxy contacts are shown in Table 3. The resistivity of the samples is about 1 Ohm-cm, which is better by six-orders of magnitude than that of former research outcomes. The resistivity of irradiated samples only increased slightly from just below 1 Ohm-cm to below 2 Ohm-cm. These results show that the doping process of the present invention reduces the damage to the GaN structure significantly compared to method using a higher ratio of fast neutron flux to epithermal neutron flux. The gold contacts on the samples were applied by hand and can contribute to the variability of the resistivity measurements. The carrier concentration and mobility data vary considerably between the samples. It is believed this variability is because of the irradiation process introduces defects into the samples. It is believed that the annealing process removes the majority of these defects which results in more consistent data.

Referring to FIG. 4, XRD data from and untreated control sample, irradiated sample, and irradiated and annealed sample are shown in FIG. 4. The data is offset to show the matching peaks. The XRD spectra of the annealed samples does not change much compared to the spectra before irradiation process and the spectrum of the untreated sample. The peaks position and insensitive are quite similar to each other on all 3 spectra. Usually, the irradiation process typically causes a significant number of dislocations or defects on the crystal lattice. However, in these samples, these do not appear to have a strong effect on the crystal structure as shown in the XRD spectra.

Referring to FIGS. 5 and 6, the transmittance curves of the GaN sample shown represent significant improvement with no step in the UV region. The transmittance spectra of GaN B and C wafers which were irradiated for 60 hours are shown in FIGS. 5 and 6, respectively. The transmittances of the irradiated samples were almost identical across all wafers. At 700 nm, the transmittance of the samples was above 41% and dropping to about 2% at 450 nm. The data also shows that the transmittance in the UV region was zero for all samples.

The transmittance spectra of the clean irradiated and annealed GaN samples are shown in FIG. 7. In the visible region, the transmittances of the irradiated samples at 700 nm were about 60% and dropping to about 50% at 450 nm. The UV-Vis spectra of the annealed GaN C samples show the significant improvement in transmittance especially in the near UV region. These results suggest that most of the damage done in the transmutation process has been reversed after the annealing process.

The UV-Vis spectra of the GaN C11 sample before and after annealing are shown in FIG. 8 alongside the spectra of an untreated GaN wafer. In the unannealed wafer there was a significant reduction in the transmittance at the beginning of the spectrum, 700 nm. In the unannealed sample this range has a transmittance of 41.3%, while the annealed and untreated samples had a transmittance of 59.4% and 63.7%, respectively. As a result, the annealed sample within 5% of the original transmittance. This drop in transmittance is even more significant closer to the UV region. For the unannealed sample at 450 nm the transmittance is 1.3%, while the annealed and the untreated were at 48% and 57%, respectively.

Referring to FIG. 9, C-V measurement was performed with the MSI mercury-probe to provide a Schottky contact with GaN samples. In this set up, the samples were place on top of the chuck covering the mercury contact holes. Mercury was forced through the holes toward the sample via a vacuum of 0.3 bar. The diameter of the mercury dot is 0.713 mm. The circuit was completed with the stainless steel back contact of the mercury probe. Although each samples had four small Al contacts at the corners (for Hall measurement), the back contact with the stainless-steel head is not ideal. The measurement was completed using the HP4279A C-V meter with the frequency of 1 MHz and a voltage sweep from 0V to −5V with the step of 0.2V.

The C-V curves of GaN C samples after irradiating and annealing process are shown in FIG. 9. The data from all samples are quite similar to each other. The capacitance of the samples after annealing process was in the order of $10^{10}$ F. The curves are in agreement with a Schottky contact between a mercury probe and n-type GaN semiconductor. FIG. 10 shows the $1/C^2$ plot which is derived from the C-V measurement. The curve is a straight line from which the built-in voltage can be approximated. The built-in voltage was estimated to be 1.15V from the curve. This result is higher than the theoretical Schottky barrier formed between the mercury probe and GaN wafer.

Referring to FIG. 11, SIMS measurement was done by our partner at EAG Laboratories. The measurement results on the front side of the $10^{18}$ Ge atoms/cm$^3$ concentration GaN wafer are shown in FIG. 11. The concentration of $^{70}$Ge and $^{72}$Ge across the depth of more than 3 μm in the GaN was very uniform. The average concentration of $^{72}$Ge across the measurement depth was 5.61×10$^{17}$/cm$^3$. The average concentration of $^{70}$Ge across the measurement depth was 3.23×10$^{17}$/cm$^3$. The average concentration of both Ge was 8.84×10$^{17}$/cm$^3$. This result was very close to the measurement data from gamma ray spectroscopy which shows the concentration of both $^{70}$Ge and $^{72}$Ge at 1.06×10$^{18}$/cm$^3$. The data of the initial several nano-meters are not valid because of the dynamic SIMS surface transient and surface contamination.

The measurement results on the back side of the same GaN wafer are shown in FIG. 12. The concentration of $^{70}$Ge and $^{72}$Ge was also very uniform across the depth of more than 3 μm. The average concentration of $^{72}$Ge across the measurement depth was 5.91×10$^{17}$/cm$^3$. The average concentration of $^{70}$Ge across the measurement depth was 3.37×10$^{17}$/cm$^3$. The average concentration of both Ge isotopes was 9.29×10$^{17}$/cm$^3$. The SIMS measurement results on the front and back sides of the $10^{18}$ Ge atoms/cm$^3$ concentration GaN wafer confirm the excellent quality of the neutron transmutation doping process. The Ge dopant distributes very uniformly throughout the bulk wafer from end to end which is one of the main objectives of the project.

Example 2

To reduce the $^{14}$C concentration in GaN wafer after neutron irradiation process, we conducted new irradiations of GaN using epithermal neutron in the Topaz area of the University of Missouri-Columbia Research Reaction (MURR). In the Topaz area, thermal neutrons are cut off by special shielding around the location. Due to the cross sections of the epithermal neutron reactions with Ga was much higher than N as shown in FIGS. 13A and 13B, using only epithermal neutrons leads to a decrease in the $^{14}$C production in the GaN with the same doping concentration. The epithermal neutron flux in this area of the reactor was high, an irradiation to create a doping concentration of $10^{17}$ Ge atoms/cm$^3$ was achieved in less time compared to using mostly thermal neutron. We also fabricated special holders to protect the samples during the irradiation process.

The holders were sealed to isolate the GaN wafer from the water of the reactor. The results of the irradiations are shown in FIG. 14. The first sample on the left was the sample irradiated with thermal neutron. It was not been annealed but had been doped to the same concentration as the epithermal neutron irradiated samples. The second sample was irradiated with epithermal neutron in the Topaz area of the reactor in the weld sealed container. It has significantly less discoloration when compared to the sample irradiated with thermal neutron. We believe the decrease in $^{14}$C production also likely the reason for this damage reduction. $^{14}$C is produced in a (n,p) reaction, meaning a neutron react with a N-14 atom and replaces a proton in the nucleus. These protons generated might damage the GaN lattice structure creating the discoloration in the samples. The flux in the Topaz location was measured to be 2.6×10$^{12}$ n/cm$^2$/s for the epithermal neutron. The 20 hour irradiation results in a 1.24×10$^{17}$ Ge atoms/cm$^3$.

After the success of the initial test, we completed the irradiation of several GaN samples in the Topaz section of MURR. Fourteen different samples were irradiated in the location. Two different holders were used in the irradiation process. One holder contained a 2-inch wafer and 2-1 cm×1 cm samples. The other container contained 11-1 cm×1 cm samples. These two containers were irradiated in the Topaz section of the reactor for 20 hours. Below in Table 4 are the Ge concentrations of the GaN samples in these experiments.

TABLE 4

Doping concentrations of Topaz irradiated samples.

| Sample Name | Ge Concentration (Ge atoms/cm$^3$) |
|---|---|
| GaNT 1 | 1.24 × 10$^{17}$ |
| GaNT 2 | 1.20 × 10$^{17}$ |
| GaNT 3 | 1.26 × 10$^{17}$ |
| GaNT 4 | 1.18 × 10$^{17}$ |
| GaNT 5 | 1.23 × 10$^{17}$ |
| GaNT 6 | 1.22 × 10$^{17}$ |
| GaNT 7 | 1.18 × 10$^{17}$ |
| GaNT 8 | 1.20 × 10$^{17}$ |
| GaNT 9 | 1.22 × 10$^{17}$ |
| GaNT 10 | 1.21 × 10$^{17}$ |
| GaNT 11 | 1.23 × 10$^{17}$ |
| GaNT 12 | 1.25 × 10$^{17}$ |
| GaNT 13 | 1.22 × 10$^{17}$ |
| GaNT 14 | 1.25 × 10$^{17}$ |

FIG. 15 shows the locations within the holders where the samples were during irradiation. In addition to the wafers, the holders also contained cobalt and nickel flux wires. These wires along with the samples were measured for radioactive activity by a HPGe gamma ray counter. The activity counts were then used to determine the germanium doping in each wafer. After irradiation the samples showed the same brown discoloration usually present in these samples, as shown on the 2-inch wafer in FIG. 16.

The $^{14}$C concentration in irradiated GaN was measured using a secondary ion mass spectroscopy (SIMS) method at EAG Laboratory. The SIMS measurement result for the $^{14}$C concentration of GaN wafer irradiated with thermal neutron with the Ge doping concentration of 8×10$^{16}$ cm$^{-3}$ are shown in FIG. 17. The data shows a very uniform and consistent concentration of $^{14}$C across the depth of the wafer. The average concentration of $^{14}$C was 3.23×10$^{16}$ cm$^{-3}$. The ratio of $^{14}$C to Ge concentration of this sample was 0.4.

$^{14}$C concentration of GaN wafer irradiated in the Topaz location with the Ge doping concentration of 1.12×10$^{17}$ cm$^{-3}$ are shown in FIG. 18. The average $^{14}$C concentration across the wafer was 1.85×10$^{16}$ cm$^{-3}$. The ratio of $^{14}$C to Ge concentration of this sample was 0.16. The Topaz area has shielding around the location which significantly reduce the thermal neutron flux. Since Ga has significantly higher cross section with epithermal neutron than N, the C to Ge concentration ratio of the sample irradiated with epithermal neutron was significantly lower than the one with thermal neutron.

The samples were annealed in ammonia environment at high temperature to reverse the damage from the irradiation process. The annealing chamber was purged with nitrogen and pumped back down to 1 millitorr with a 1 millitorr/minute rate of rise. The chamber was then filled with 10 torr of ammonia and then heated to 950° C. for 30 minutes. The results of this test are shown in FIG. 19. After the annealing process, the discoloration of the sample disappears indicating that most of the damages from the irradiation process were reversed. The surface of the sample was mirror like indicating that no noticeable surface damage happens during the annealing process.

Using a mercury probe several C-V measurements were conducted. The samples were polished only on one side making the use of the Hg probe difficult in certain configurations. The C-V curves and the carrier concentration calculations were different for different measurement configurations. The configuration used in previous measurements was using the dot of mercury contact on one side of the sample and an aluminum backing on the other side.

FIG. 20 shows the C-V curve of the annealed sample irradiated with epithermal neutron. The black curve is the measurement result with the mercury dot electrode on the smooth surface and aluminum electrode on the rough surface. The red curve is the measurement result with the mercury dot electrode on the rough surface and aluminum electrode on the smooth surface. FIG. 21 shows the calculated 1/C$^2$-V curve of the annealed sample irradiated epithermal neutron. With the mercury dot contacts on the rough surface of the sample and the aluminum contact on the polished side, the carrier concentration was measured as −2.27×10$^{17}$ which would be much in-line with our expected value as the carrier concentration of the samples prior to irradiation was about −1×10$^{17}$ and gamma-ray spectroscopy measured the germanium concentration at 1×10$^{17}$ Ge atoms/cm$^3$. However, the calculated carrier concentration with mercury dot electrode on the smooth surface was 1.39×10$^{18}$/cm$^3$.

We used one more electrode configuration to confirm the carrier concentration calculation. This time, both mercury dot and ring electrodes were used on the smooth surface of the sample. As shown in FIG. 22, the C-V curve is very similar to the one with mercury dot on the smooth surface and aluminum electrode on the rough surface. The calculated carrier concentration from the 1/C$^2$-V curve in FIG. 23 with both mercury dot and ring electrodes on the smooth surface was 1.83×10$^{18}$/cm$^3$, very similar to the result with only mercury dot on smooth surface. The high carrier concentration might come from the original substrate, not the result of the neutron transmutation doping process. Carrier concentration of the measurement results with mercury dot on the rough surface might be distorted by a different contact area. Table 5 shows the carrier concentration of all 3 measurements. The "slope" section of Table 5 refers to the slope of the 1/C$^2$-V chart for both the rough and smooth contacts. This number was used in the calculation of the carrier concentration.

TABLE 5

The difference in carrier concentrations with different electrode arrangements.

| Sample | Slope | Carrier Concentration |
|---|---|---|
| Hg dot on smooth surface | −7.20E+17 | −1.39E+18 |
| Hg dot on rough surface | −4.42E+18 | −2.27E+17 |
| Hg dot and ring on smooth surface | −5.46E+17 | −1.83E+18 |

Unless otherwise defined, all technical and scientific terms used herein have the same meaning as commonly understood by one of ordinary skill in the art to which this disclosure belongs. The terminology used herein is for the purpose of describing particular example embodiments only and is not intended to be limiting. As used herein, the singular forms "a", "an", and "the" may be intended to include the plural forms as well, unless the context clearly indicates otherwise. The terms "comprises", "comprising", "including", and "having" are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps can be employed.

Although the terms first, second, third, etc. can be used herein to describe various elements, objects, devices, apparatuses, components, regions or sections, etc., these elements, objects, devices, apparatuses, components, regions or sections, etc., should not be limited by these terms. These terms may be used only to distinguish one element, object, device, apparatus, component, region or section, etc., from another element, object, device, apparatus, component, region or section, etc., and do not necessarily imply a sequence or order unless clearly indicated by the context.

The description herein is merely exemplary in nature and, thus, variations that do not depart from the gist of that which is described are intended to be within the scope of the teachings. Moreover, although the foregoing descriptions and the associated drawings describe example embodiments in the context of certain example combinations of elements and/or functions, it should be appreciated that different combinations of elements and/or functions can be provided by alternative embodiments without departing from the scope of the disclosure. Such variations and alternative combinations of elements and/or functions are not to be regarded as a departure from the spirit and scope of the teachings.

What is claimed is:

1. A method for producing a doped nitride-based semiconductor material comprising:
    emitting an initial stream of neutron irradiation comprising thermal flux, epithermal flux, and fast neutron flux toward a nitride-based semiconductor workpiece in a nuclear reactor;
    reducing a density of fast neutron flux and/or thermal neutron flux in the initial stream of neutron irradiation to produce a modulated stream of neutron irradiation, wherein the modulated stream of neutron irradiation has:
- a ratio of epithermal flux density to fast neutron flux density that is greater than a ratio of epithermal flux density to fast neutron flux density in the initial stream of neutron irradiation and/or
- a ratio of epithermal flux density to thermal neutron flux density that is greater than a ratio of epithermal flux density to thermal neutron flux density in the initial stream of neutron irradiation; and bombarding the workpiece with the modulated stream of neutron irradiation to effect transmuting a proportion of a first element in the workpiece to a second element to produce the doped nitride-based semiconductor material.

2. The method of claim 1, wherein a neutron absorber material is introduced to the nuclear reactor to reduce the density of the fast neutron flux and/or thermal neutron flux in the initial stream of neutron irradiation.

3. The method of claim 2, wherein the neutron absorber material comprises at least one element selected from the group consisting of boron, titanium, cobalt, molybdenum, cadmium, indium, hafnium, samarium, europium, gadolinium, dysprosium, erbium, ytterbium, and combinations thereof.

4. The method of claim 2, wherein the neutron absorber material comprises at least one element selected from the group consisting of boron, cadmium, hafnium, and combinations thereof.

5. The method of claim 2, wherein the workpiece is held in a container comprising the neutron absorber material.

6. The method of claim 1, comprising reducing the density of thermal neutron flux in the initial stream of neutron irradiation.

7. A method for producing a doped nitride-based semiconductor material comprising:
bombarding a nitride-based semiconductor workpiece with a stream of neutron irradiation in a nuclear reactor to effect transmuting a proportion of a first element in the workpiece to a second element to produce the doped nitride-based semiconductor material, wherein the neutron irradiation comprises a thermal flux, epithermal flux, and fast neutron flux; and wherein the stream of neutron irradiation reaching the workpiece has a ratio of epithermal neutron flux density to fast neutron flux density that is about 1:1000 or greater.

8. The method of claim 1, further comprising positioning the workpiece in a zone of a nuclear reactor that has a preferentially greater ratio of epithermal flux density to fast neutron flux density based on a map of relative flux densities in the reactor.

9. A method for producing a doped nitride-based semiconductor material comprising:
positioning a nitride-based semiconductor workpiece in a zone of a nuclear reactor that has a preferentially greater ratio of an epithermal flux density to a fast neutron flux density based on a map of relative flux densities in the reactor; and
bombarding the workpiece with a stream of neutron irradiation in the zone of the nuclear reactor to effect transmuting a proportion of a first element in the workpiece to a second element to produce the doped nitride-based semiconductor material.

10. The method of claim 9, further comprising reducing a density of thermal neutron flux in the stream of neutron irradiation.

11. The method of claim 9, wherein a neutron absorber material is introduced to the nuclear reactor to reduce the density of the thermal neutron flux and/or thermal neutron flux in the stream of neutron irradiation.

12. The method of claim 11, wherein the neutron absorber material comprises at least one element selected from the group consisting of boron, titanium, cobalt, molybdenum, cadmium, indium, hafnium, samarium, europium, gadolinium, dysprosium, erbium, ytterbium, and combinations thereof.

13. The method of claim 11, wherein the neutron absorber material comprises at least one element selected from the group consisting of boron, cadmium, hafnium, and combinations thereof.

14. The method of claim 11, wherein the workpiece is held in a container comprising the neutron absorber material.

15. The method of claim 1, wherein the transmuting comprises transmuting a quantity of $^{14}N$ to $^{14}C$.

16. The method of claim 1, wherein the workpiece comprises at least one metal selected from the group consisting of Al, Ga, In, and combinations thereof.

17. The method of claim 1, wherein the workpiece comprises Ga.

18. The method of claim 1, wherein the transmuting comprises transmuting a quantity of Ga to Ge.

19. The method of claim 1, further comprising annealing the doped nitride-based semiconductor material.

* * * * *